(12) United States Patent
Lamesch et al.

(10) Patent No.: US 9,764,668 B2
(45) Date of Patent: Sep. 19, 2017

(54) DIAGNOSTIC CAPACITIVE OCCUPANCY OR PROXIMITY DETECTOR

(71) Applicant: IEE INTERNATIONAL ELECTRONICS & ENGINEERING S.A., Echternach (LU)

(72) Inventors: Laurent Lamesch, Reichlange (LU); Michael Puetz, Trier (DE); David Hoyer, Ayl (DE); Andreas Petereit, Schweich (DE); Thomas Meyers, Bitburg (DE); Frank Althaus, Saarbrucken (DE); Michael Virnich, Korlingen (DE)

(73) Assignee: IEE International Electronics & Engineering S.A, Echternach (LU)

( * ) Notice: Subject to any disclaimer, the term of this patent is extended or adjusted under 35 U.S.C. 154(b) by 77 days.

(21) Appl. No.: 14/646,731

(22) PCT Filed: Nov. 12, 2013

(86) PCT No.: PCT/EP2013/073593
§ 371 (c)(1),
(2) Date: May 21, 2015

(87) PCT Pub. No.: WO2014/079735
PCT Pub. Date: May 30, 2014

(65) Prior Publication Data
US 2015/0298590 A1    Oct. 22, 2015

(30) Foreign Application Priority Data
Nov. 22, 2012    (LU) .......................................... 92102

(51) Int. Cl.
*B60N 2/56*    (2006.01)
*B60N 2/00*    (2006.01)
(Continued)

(52) U.S. Cl.
CPC ........... *B60N 2/5678* (2013.01); *B60N 2/002* (2013.01); *B60N 2/5685* (2013.01); *G01V 3/088* (2013.01);
(Continued)

(58) Field of Classification Search
None
See application file for complete search history.

(56) References Cited

U.S. PATENT DOCUMENTS 6,392,542 B1    5/2002    Stanley
6,703,845 B2    3/2004    Stanley et al.
(Continued)

FOREIGN PATENT DOCUMENTS

WO         9217344 A1    10/1992
WO         03049970 A1    6/2003
WO         2012113833 A1    8/2012

OTHER PUBLICATIONS

International Search Report and Written Opinion issued Dec. 20, 2013 re: Application No. PCT/EP 2013/073593; WO 2012/113833 A1, WO 03/049970 A1 and US 2011/121618 A1.
(Continued)

*Primary Examiner* — Jermele M Hollington
*Assistant Examiner* — Douglas X Rodriguez
(74) *Attorney, Agent, or Firm* — Reising Ethington P.C.

(57) ABSTRACT

A capacitive occupancy or proximity detector (10) comprises a heating circuit, an impedance measurement circuit (34, 36, 40) and a diagnostic circuit. The heating circuit includes a heating element (12). The impedance measurement circuit is connected to the heating element so as to measure impedance between the heating element and a node at ground potential. The diagnostic circuit is configured for measuring electrical resistance across the heating circuit and includes a heating current sensor (42), configured for sensing a heating current across the heating circuit, a current supply device (48) for driving a diagnostic current across the heating circuit and a current limiting ground path (50), configured for draining the diagnostic current and for blocking the heating current.

24 Claims, 4 Drawing Sheets (51) Int. Cl.
*H03K 17/96* (2006.01)
*G01V 3/08* (2006.01)
(52) U.S. Cl.
CPC ............... *H03K 17/962* (2013.01); *H03K 2217/960705* (2013.01)

(56) References Cited

U.S. PATENT DOCUMENTS

| | | |
|---|---|---|
| 7,521,940 B2 | 4/2009 | Koch et al. |
| 2009/0295199 A1 | 12/2009 | Kincaid et al. |
| 2011/0121618 A1 | 5/2011 | Fischer et al. |
| 2011/0240751 A1* | 10/2011 | Rauh ............... B64D 13/00 236/91 D |
| 2012/0043971 A1* | 2/2012 | Maharyta ........... G01R 27/2605 324/658 |

OTHER PUBLICATIONS

Joshua Smith et al. "Electric Field Sensing for Graphical Interfaces", IEEE Computer Graphics and Applications; May/Jun. 1998; pp. 54-60.

\* cited by examiner

DIAGNOSTIC CAPACITIVE OCCUPANCY OR PROXIMITY DETECTOR

TECHNICAL FIELD

The present invention generally relates to a capacitive occupancy or proximity detector that can use a heating element as its antenna electrode. A capacitive occupancy or proximity detector as proposed herein may e.g. be used for detecting the absence or presence of an occupant on an occupiable item, which might be a vehicle seat, a hospital bed etc., or for detecting a driver's hand on the steering wheel.

BACKGROUND ART

A capacitive sensor, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode at which the influence of an object or living being on the electric field is detected. In some (so-called "loading mode") capacitive occupancy sensors, the one or more antenna electrodes serve at the same time as sensing electrodes. In this case, the measurement circuit determines the current flowing into the one or more antenna electrodes in response to an oscillating voltage being applied to them. The relationship of voltage to current yields the complex impedance of the one or more antenna electrodes. In an alternative version of capacitive sensors ("coupling mode" capacitive sensors), the transmitting antenna electrode(s) and the sensing electrode(s) are separate from one another. In this case, the measurement circuit determines the current or voltage that is induced in the sensing electrode when the transmitting antenna electrode is operating.

The different capacitive sensing mechanisms are explained in the technical paper entitled "Electric Field Sensing for Graphical Interfaces" by J. R. Smith, published in Computer Graphics I/O Devices, Issue May/June 1998, pp 54-60. The paper describes the concept of electric field sensing as used for making non-contact three-dimensional position measurements, and more particularly for sensing the position of a human hand for purposes of providing three-dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling. "Shunt mode" is alternatively referred to as the above-mentioned "coupling mode".

Capacitive occupant sensing systems have been proposed in great variety, e.g. for controlling the deployment of one or more airbags, such as e.g. a driver airbag, a passenger airbag and/or a side airbag. U.S. Pat. No. 6,392,542, to Stanley, teaches an electric field sensor comprising an electrode mountable within a seat and operatively coupled to a sensing circuit.

The idea of using the heating element of a seat heater as an antenna electrode of a capacitive occupancy sensing system has been known for a long time. WO 92/17344 A1 discloses a an electrically heated vehicle seat with a conductor, which can be heated by the passage of electrical current, located in the seating surface, wherein the conductor also forms one electrode of a two-electrode seat occupancy sensor.

U.S. Pat. No. 7,521,940 relates to a combined seat heater and capacitive sensor capable of operating, at a time, either in heating mode or in occupant-sensing mode. The device includes a sensor/heat pad for transmitting a sensing signal, a first diode coupled to a first node of the sensor/heat pad, a second diode coupled to a second node of the sensor/heat pad, a first transistor coupled to the first diode and a second transistor coupled to the second diode. During sensing mode, the first and second transistors are opened and the nodes between the first transistor and the first diode, as well as between the second transistor and the second diode are reverse-biased to isolate the sensor/heat pad from the power supply of the heating circuit.

US 2009/0295199 discloses a combined seat heater and capacitive sensor, wherein each of the two nodes of the heating element is connected to the heating power supply via two transistors in series. The device may not operate in sensing mode and in heating mode at a time. When the device is in sensing mode, the nodes between each pair of transistors are actively kept at the same potential as the heating element by means of respective voltage followers in order to neutralize any open-switch impedance of the transistors.

The very same idea has already been disclosed in U.S. Pat. No. 6,703,845. As an alternative to transistors, that document discloses inductors to achieve a high impedance at the frequency of the oscillating signal between the heating element and the power source of the heating circuit. As in the previously discussed document, a voltage follower maintains the intermediate nodes substantially at the same potential as the heating element in order to effectively isolate, at the frequency of the oscillating signal, the power supply of the heating circuit from the heating element.

A disadvantage of the system disclosed in U.S. Pat. No. 6,703,845 is that the inductors used as AC-decoupling elements have to support the full heating current (up to 10 A DC and more) and present high AC impedance to the capacitive measurement circuit and the seat heater at the same time. High inductance and high operating DC current implies that the inductor have to be wound on large cores, which are expensive. Depending on the application chosen from U.S. Pat. No. 6,703,845, either two or four of these inductors have to be used.

US 2011/121618 discloses yet another variant of an occupant detection system including a heating element adjacent the seating surface of a seat. A capacitive occupant detection circuit is electrically coupled to the heating element. A common mode choke is interposed between the heating circuit and the heating element as an isolation circuit that prevents the heating circuit from influencing the occupant detection circuit.

When capacitive occupancy or proximity detection systems use a heating element as the antenna electrode, the heating element potentially becomes a safety-relevant system component. It may thus be necessary to monitor the good functioning of the heating element in order to rule out a false reading by the capacitive occupancy or proximity detection system.

BRIEF SUMMARY

The invention overcomes the above-mentioned problem by providing a capacitive occupancy or proximity detector as described herein.

A capacitive occupancy or proximity detector comprises a heating circuit, an impedance measurement circuit and a diagnostic circuit for checking the integrity of the device. The heating circuit includes a heating element connected between a first and a second node, which are provided for connecting the heating circuit to a heating current source. The impedance measurement circuit is connected to the heating element in such a way as to measure impedance between the heating element and a node at ground potential (e.g. the vehicle chassis if the detector is arranged in a vehicle). According to an aspect of the invention, the diagnostic circuit is configured for measuring electrical resistance across the heating circuit between the first and second nodes and includes a heating current sensor arranged in the heating circuit, configured for sensing a heating current (typically in the range from 1 to 15 A) across the heating circuit, a current supply device connected to one of the first and second nodes for driving a diagnostic current (e.g. in the range from 10 to 100 mA) across the heating circuit and a current limiting ground path connected to the other of the first and second nodes, configured for draining the diagnostic current and for blocking the heating current.

As will be appreciated, the proposed configuration allows a diagnosis of the heating circuit both while it is on (heating) and while it is off. In order to diagnose the seat heating circuit, the diagnostic circuit preferably begins by using the heating current sensor to measure the current flowing across the heating element. Supposing that the current expected to occur between the first and second nodes is known, if the measured current is within a predefined range, a circuit interruption and/or a short circuit may be excluded and the diagnosis ends. If too high current is detected, a short circuit is deemed to have occurred. If the measured current is below the predefined range, this can have several causes: (a) the seat heater is off, (b) the heating circuit is interrupted or both (a) and (b) at the same time. In order to resolve this ambiguity, the current supply device attempts to drive a diagnostic current across the heating element. Since there are heater control units, which disconnect both the high and low potential ends of the heating element, a ground path is provided over which the diagnostic current generated by the current supply device can flow to ground. If the diagnostic current flows as intended (i.e. is comprised within a predefined range), the heating circuit is considered intact for the purpose of capacitive detection. If the diagnostic current is too high, a short circuit is considered to have occurred and if the diagnostic current is too low, a circuit interruption is deemed to have occurred.

Preferably, the diagnostic circuit is configured for measuring a voltage drop between the first and second nodes. In this embodiment of the invention, the decision as to whether a short circuit and/or a circuit interruption has occurred can be made on the basis of the detected resistance (calculated as the ratio of the voltage drop and the measured current). More preferably, the diagnostic circuit comprises a first voltage tap connected to the first node for measuring a voltage on the first node and a second voltage tap connected to the second node for measuring a voltage on the second node.

The ground path provided for the diagnostic current is configured as a current-limiting ground path (e.g. as a saturable current sink or a self-regulating transistor network, which is low-ohmic for small currents, e.g. up to 200 mA, and high ohmic for higher currents) in order to prevent the heating current from flowing across it when the heating is working.

The heating element preferably comprises an ohmic heater, e.g. a wire made of resistive material or a resistive trace printed on a substrate. The heating element may be made of positive-temperature-coefficient (PTC) material, i.e. a material the electrical resistance of which increases with increasing current flowing across it.

According to a preferred embodiment of the invention, the current supply device comprises a voltage source and at least one of the current supply device and the current limiting ground path comprises a diagnostic current sensor for sensing the diagnostic current. Alternatively or additionally, the current supply device may comprise a current source.

The heating circuit may comprise a common mode choke for AC-decoupling the heating element from the high and low potential sides of the heating current source. The common mode choke comprises a first winding connected between the first node and the heating element and a second winding connected between the heating element and the second node.

The heating current sensor could be configured for measuring a voltage drop across at least one of the first and second windings. The value of the heating current can in this case be calculated as the ratio of the voltage drop by the resistance of the winding.

A preferred aspect of the invention relates to a combined seat heater and seat occupancy sensor, comprising a capacitive occupancy or proximity detector as described hereinabove.

Another preferred aspect of the invention relates to a combined steering wheel heater and hands-on-detector, comprising a capacitive occupancy or proximity detector as described hereinabove.

BRIEF DESCRIPTION OF THE DRAWINGS

Further details and advantages of the present invention will be apparent from the following detailed description of not limiting embodiments with reference to the attached drawings, wherein.

DESCRIPTION OF PREFERRED EMBODIMENTS

Figure 1:
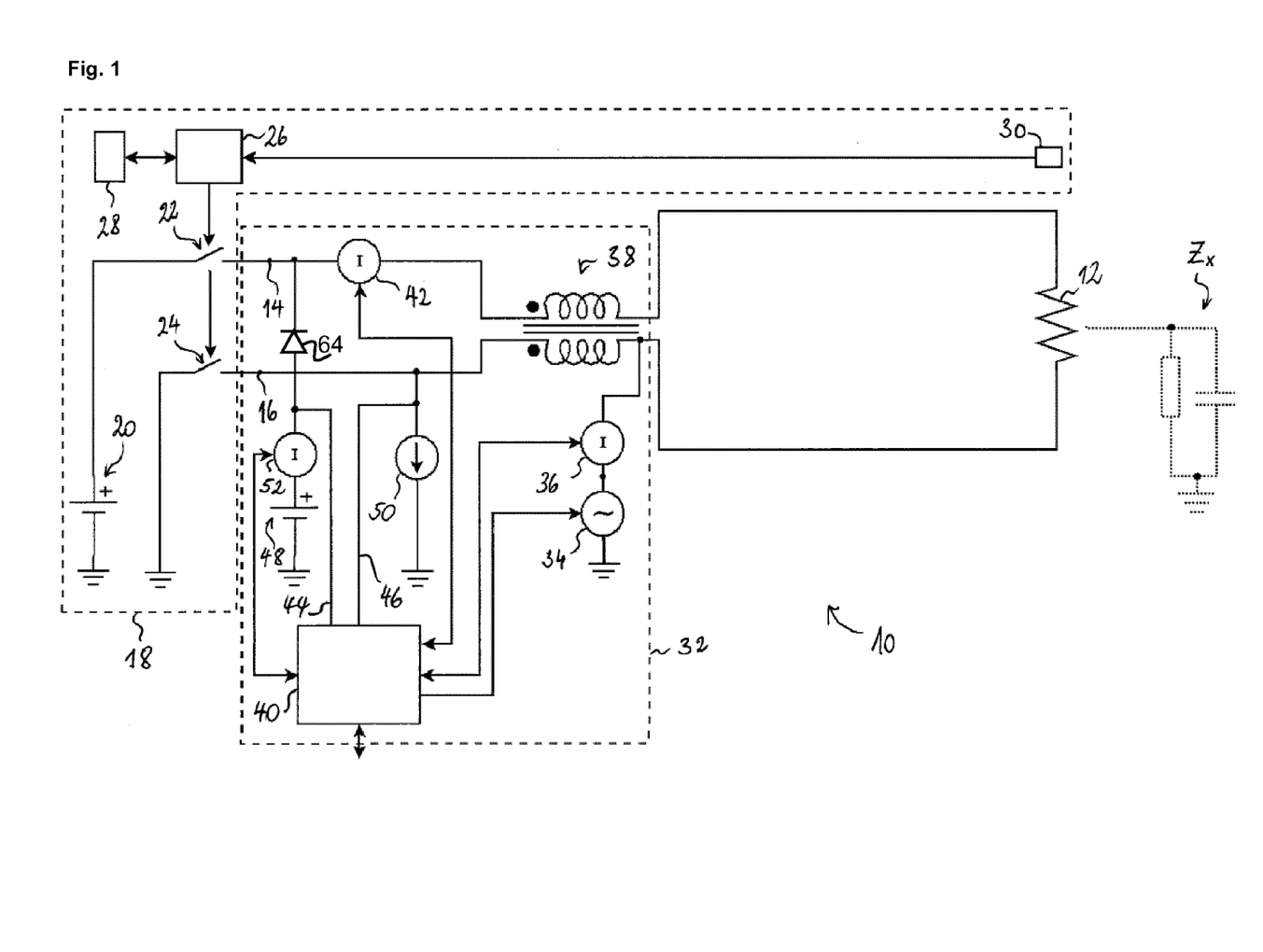
FIG. 1 is a schematic circuit diagram of a combined heater and capacitive sensor device according to a preferred embodiment of the invention.

FIG. 1 shows a combined heater and capacitive sensor device 10 according to a preferred embodiment of the invention.

The combined heater and capacitive sensor device 10 comprises an ohmic heating element 12, which produces heat when traversed by an electrical current. The heating element 12 is connected between a first node 14 and a second node 16, via which it is connected to a heating current source 18. The heating current source 18 comprises a voltage source 20 (e.g. a car battery), a pair of electronically controlled switches 22, 24 (e.g. transistors) and a control unit 26 (e.g. a microcontroller), configured to open and close the switches 22, 24. The control unit 26 is connected to a control interface 28, which allows a user to switch the heater on and off and/or to set the desired heating power or temperature. The control unit 26 is further connected to a temperature sensor 30. The control unit 26 opens and closes the switches depending on the user commands (heater on or off, desired temperature) and the temperature sensed by the temperature sensor 30. Advantageously, the control unit implements a pulse-width-modulation scheme in order to achieve the desired heating power or temperature.

The heating element 12 furthermore serves as an antenna electrode of a capacitive sensor 32. The capacitive sensor comprises an oscillator 34, which applies an oscillating (AC) voltage to the heating element 12. An alternating current sensor 36 measures the alternating current that flows into the heating element 12. The alternating current depends on the complex impedance $Z_X$ (represented as a resistance and a capacitance) between the heating element 12 and ground. A common mode choke 38 is arranged in the heating circuit in order to inhibit the flow of the alternating current to ground via the heating current source 18. The alternating current sensed by the alternating current sensor 36 is evaluated by a microcontroller 40. Since the alternating current depends on the complex impedance between the heating element and ground, a conductive object or a person in the vicinity of the heating element 12 can be recognized.

The capacitive sensor further comprises a diagnostic circuit for detecting, in particular, a short circuit or a circuit interruption between the first 14 and the second node 16. The diagnostic circuit comprises a heating current sensor 42 arranged between the first node 14 and the second node 16, in series with the heating element 12. The heating current sensor 42 is configured to measure the heating current that the heating current source 18 drives across the heating element 12. The microcontroller 40 receives the measurement value (noted $I_H$) from the heating current sensor 42. The microcontroller further receives the voltage (noted $U_1$) at the first node 14 via tap 44 and the voltage (noted $U_2$) at the second node 16 via tap 46. The microcontroller may thus compute the electrical resistance between the first node 14 and the second node 16 as $R=(U_1-U_2)/I_H$. When the computed resistance is comprised in a predefined range (e.g. from 0.5 to 20 Ω), the heating circuit is considered to operate properly. If too low a resistance is measured, a short circuit is deemed to have occurred. If too high resistance is measured, no conclusion may yet be drawn, since one or both of the switches 22, 24 could be open. In order to resolve that ambiguity, voltage source 48 is connected to the first node 14 and a saturable current sink 50 is connected to the second node 16. A diagnostic current sensor 52 is provided in series with the voltage source 48 for measuring the current (noted $I_D$) flowing through the diagnostic circuit (comprising the voltage source 48, the part of the heating circuit between the first and second nodes 14, 16 and the saturable current sink 50). The resistance between the first and second nodes is calculated as: $R=(U_1-U_2)/I_D$. If the calculated resistance between the first and second nodes 14, 16 is comprised within the predefined range, the heating circuit is considered to be intact. If the calculated resistance is too high (above the predefined range), a circuit interruption is deemed to have occurred. If the calculated resistance is too low (below the predefined range), a short circuit is deemed to have occurred.

In the event of a short circuit or a circuit interruption, no reliable measurement of the complex impedance $Z_X$ can be made. The microcontroller 40 is configured to suspend any capacitive sensing when this situation arises and to issue a corresponding warning signal.

It is worthwhile noting that the saturable current sink 50 limits the current flowing across it to a very low value (e.g. between 10 and 100 mA) in order to avoid that the heating current (several A) flows to ground via the capacitive sensor and destroys it. The diagnostic current and the heating current are thus orders of magnitudes different from each other. The diagnostic current sensor 52 is therefore configured to sense small currents (e.g. in the order of tens of mA), whereas the heating current sensor 42 is configured to sense large currents (e.g. several A). The saturable current sink 50 furthermore guarantees that the diagnostic current can flow irrespective of the state of the heating current source.

It should be noted that voltage source 48 is preferably configured so as to apply a significantly smaller voltage across the heating element 12 than the heating current source 18. In this case, the measurements of the voltage difference $U_1-U_2$, of the heating current $I_H$ and the diagnostic current $I_D$ may be made simultaneously, since the microcontroller 40 can decide whether the heating current source is on or off based on the sensed voltage difference $U_1-U_2$:

if $U_1-U_2>U_{th}$ (where Uth is a predefined threshold voltage between the voltage applied by the voltage source 48 and the voltage applied by the heating current source 18), the resistance has to be calculated using the heating current, i.e. $R=(U_1-U_2)/I_H$;

if $U_1-U_2<U_{th}$, the resistance has to be calculated using the diagnostic current, i.e. $R=(U_1-U_2)/I_D$.

It is worthwhile noting that diode 64 prevents the heating current from flowing to ground across the voltage source 48.

Figure 2:
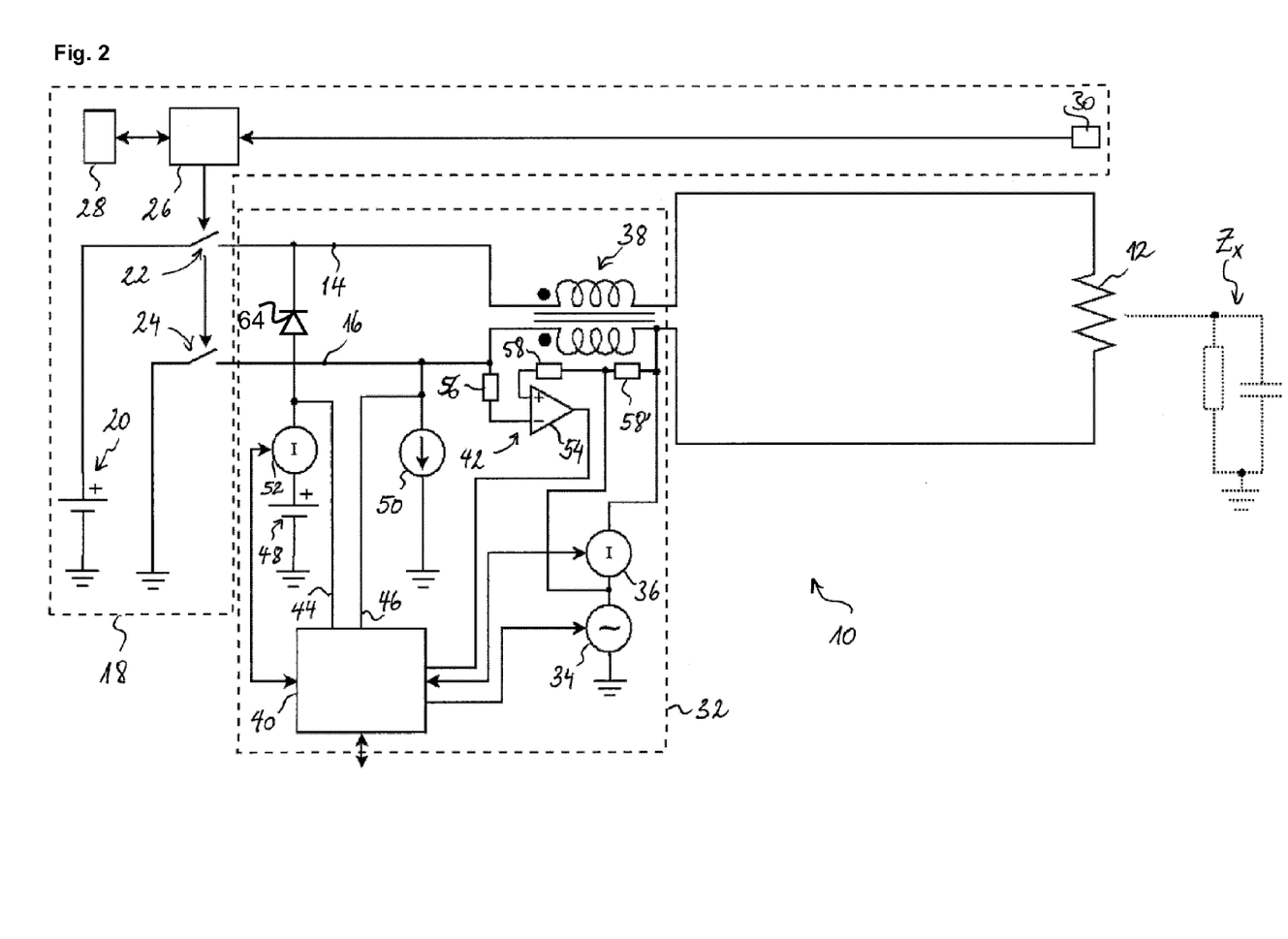
FIG. 2 is a schematic circuit diagram of a variant of the device of FIG. 1.

FIG. 2 illustrates a variant of the combined heater and capacitive sensor device of FIG. 1. The only difference with the previously discussed figure is the arrangement of the heating current sensor 42. For any other details, the reader is thus referred to the above discussion of FIG. 1.

The heating current sensor of FIG. 2 comprises an operational amplifier 54 having its first input connected to the second node 16 via a first resistor 56 and its second input connected to the heating element 12 via a couple of second resistors 58, 58'. The operational amplifier 54 thus measures the voltage drop across one of the windings of the common mode choke 38. The heating current can thus be calculated by the microprocessor as the ratio of the voltage drop measured by the operational amplifier 54 by the resistance of the winding of the common mode choke 38.

In order to avoid any significant influence of the operational amplifier on the capacitive measurement, the AC signal produced by the oscillator 34 is supplied to the node between the resistors 58 and 58'. The resistance of the resistor 58' is chosen significantly greater than the resistance of the alternating current sensor 36.

Figure 3:
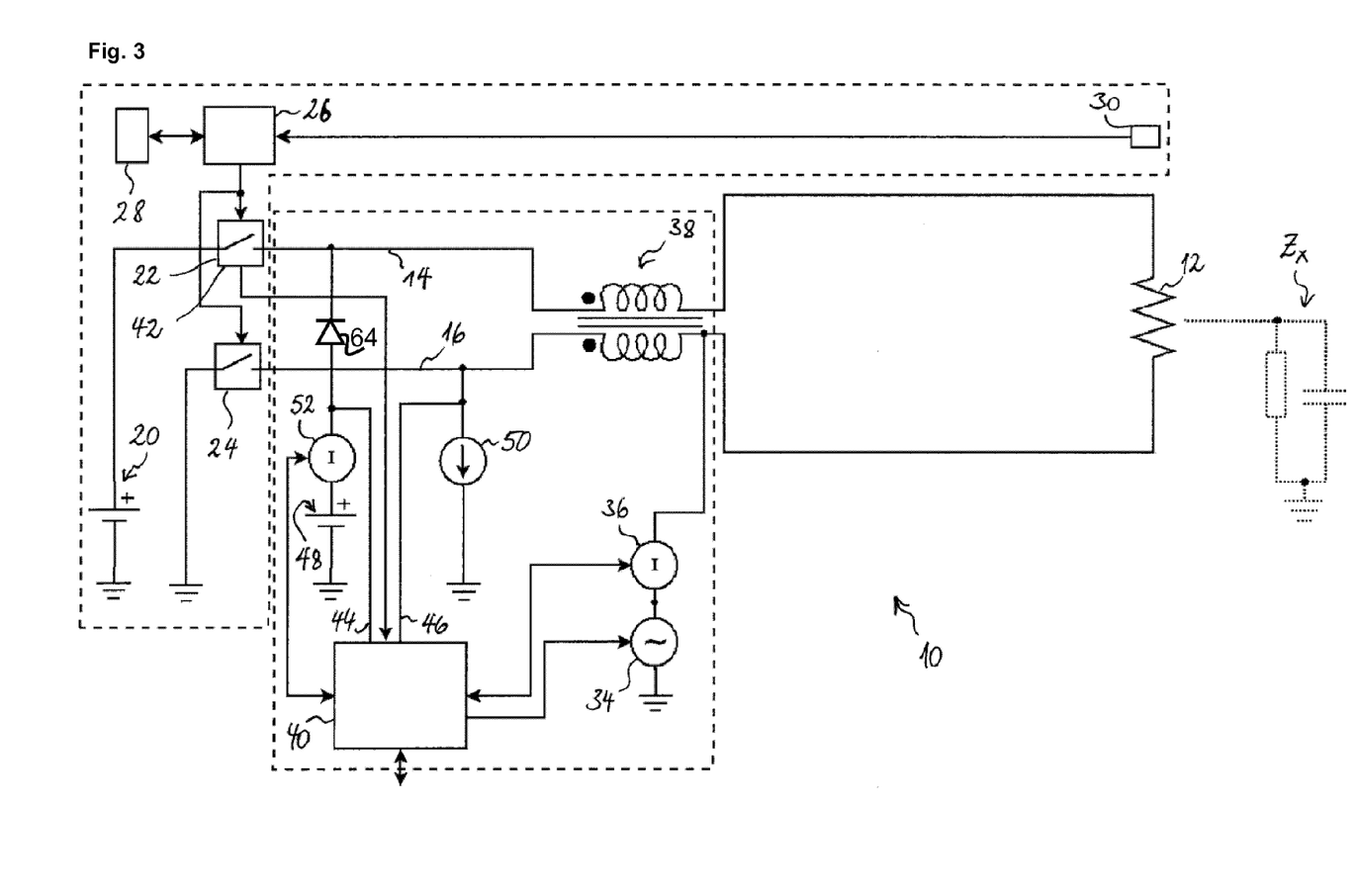
FIG. 3 is a schematic circuit diagram of another variant of the device of FIG. 1.

FIG. 3 shows yet another variant of the combined heater and capacitive sensor device of FIG. 1. The only difference with FIG. 1 is again the arrangement of the heating current sensor 42. For any other details, the reader is referred to the above discussion of FIG. 1.

In the variant shown in FIG. 3, switch 22 is implemented as switching component having a current sense feature or a current mirror feature (e.g. a corresponding MOSFET transistor). The heating current sensor 42 is thus integrated in switch 22. It is worthwhile noting that the heating current sensor could additionally or alternatively be integrated in switch 24.

Figure 4:
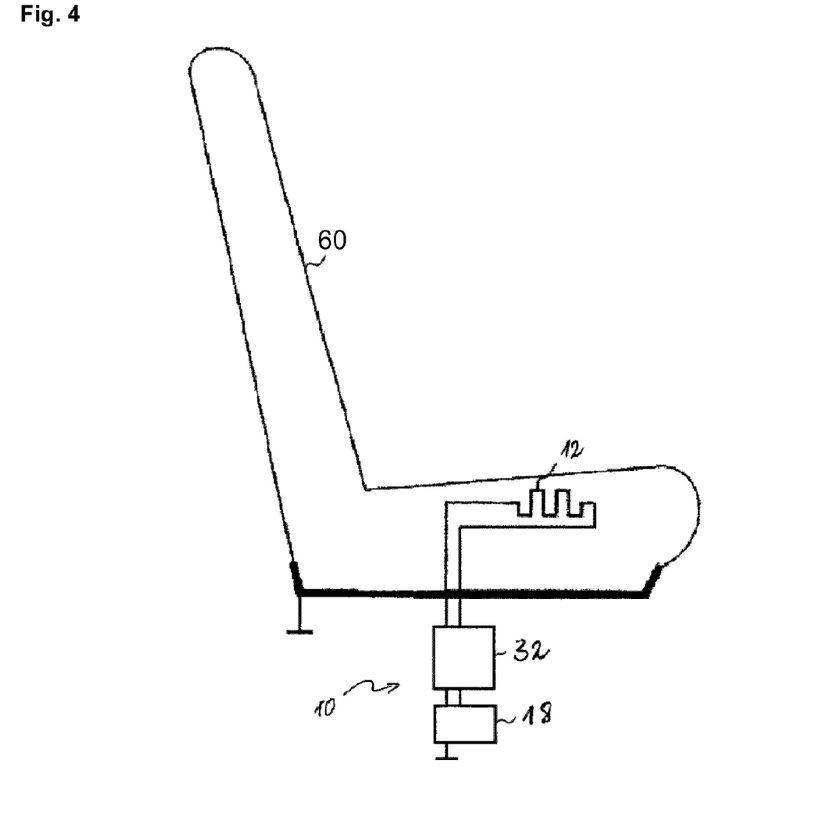
FIG. 4 is a schematic drawing of a vehicle seat equipped with a device according to a preferred embodiment of the invention.

FIG. 4 schematically shows a vehicle seat 60 equipped with a combined capacitive occupancy sensor and seat heater configured as a combined heater and capacitive sensor device 10.

Figure 5:
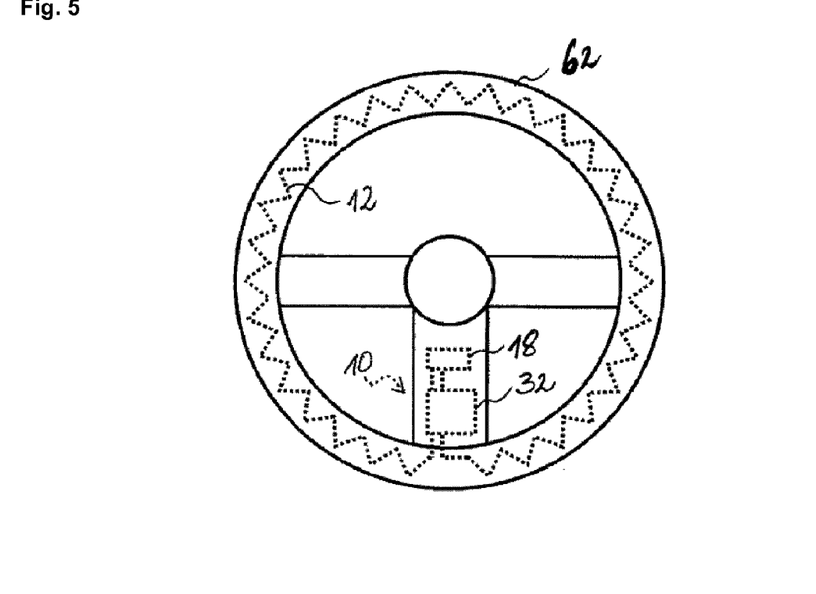
FIG. 5 is a schematic drawing of a steering wheel equipped with a device according to a preferred embodiment of the invention.

FIG. 5 schematically shows a steering wheel 62 equipped with a combined capacitive hands-on-detector and steering wheel heater configured as a combined heater and capacitive sensor device 10.

The invention claimed is:

1. A capacitive occupancy or proximity detector, comprising
 a heating circuit, including a heating element connected between a first and a second node, said first and second nodes configured to connect said heating circuit to a heating current source;
 an impedance measurement circuit connected to said heating element configured to measure impedance between said heating element and a node at ground potential; and
 a diagnostic circuit configured to measure electrical resistance across said heating circuit between said first and second nodes, said diagnostic circuit including
  a heating current sensor arranged in said heating circuit, configured to sense a heating current across said heating circuit;
  a current supply device connected to one of said first and second nodes configured to drive a diagnostic current across said heating circuit; and
  a current limiting ground path connected to the other of said first and second nodes, configured to drain said diagnostic current and to block said heating current.

2. The capacitive occupancy or proximity detector as claimed in claim 1, wherein said current supply device comprises a voltage source and wherein at least one of said current supply device and said current limiting ground path comprises a diagnostic current sensor for sensing said diagnostic current.

3. The capacitive occupancy or proximity detector as claimed in claim 1, wherein said current limiting ground path comprises a saturating current sink.

4. The capacitive occupancy or proximity detector as claimed in claim 1, wherein said heating circuit comprises a common mode choke with a first and a second winding, said first winding being connected between said first node and said heating element and said second winding being connected between said heating element and said second node.

5. The capacitive occupancy or proximity detector as claimed in claim 4, wherein said heating current sensor is configured to measure a voltage drop across at least one of said first and second windings.

6. The capacitive occupancy or proximity detector as claimed in claim 1, wherein said current supply device comprises a current source.

7. The capacitive occupancy or proximity detector as claimed in claim 1, wherein said diagnostic circuit is configured to measure a voltage drop between said first and second nodes.

8. The capacitive occupancy or proximity detector as claimed in claim 1, wherein said diagnostic circuit comprises a first voltage tap connected to said first node configured to measure a voltage on said first node and a second voltage tap connected to said second node configured to measure a voltage on said second node.

9. A combined seat heater and seat occupancy sensor comprising a capacitive occupancy or proximity detector, said capacitive occupancy or proximity detector, comprising
 a heating circuit, including a heating element connected between a first and a second node, said first and second nodes configured to connect said heating circuit to a heating current source;
 an impedance measurement circuit connected to said heating element configured to measure impedance between said heating element and a node at ground potential; and
 a diagnostic circuit configured to measure electrical resistance across said heating circuit between said first and second nodes, said diagnostic circuit including
  a heating current sensor arranged in said heating circuit, configured to sense a heating current across said heating circuit;
  a current supply device connected to one of said first and second nodes configured to drive a diagnostic current across said heating circuit; and
  a current limiting ground path connected to the other of said first and second nodes, configured to drain said diagnostic current and to block said heating current.

10. The combined seat heater and seat occupancy sensor as claimed in claim 9, wherein said current supply device comprises a voltage source and wherein at least one of said current supply device and said current limiting ground path comprises a diagnostic current sensor configured to sense said diagnostic current.

11. The combined seat heater and seat occupancy sensor as claimed in claim 9, wherein said current limiting ground path comprises a saturating current sink.

12. The combined seat heater and seat occupancy sensor as claimed in claim 9, wherein said heating circuit comprises a common mode choke with a first and a second winding, said first winding being connected between said first node and said heating element and said second winding being connected between said heating element and said second node.

13. The combined seat heater and seat occupancy sensor as claimed in claim 12, wherein said heating current sensor is configured to measure a voltage drop across at least one of said first and second windings.

14. The combined seat heater and seat occupancy sensor as claimed in claim 9, wherein said current supply device comprises a current source.

15. The combined seat heater and seat occupancy sensor as claimed in claim 9, wherein said diagnostic circuit is configured to measure a voltage drop between said first and second nodes.

16. The capacitive occupancy or proximity detector as claimed in claim 9, wherein said diagnostic circuit comprises a first voltage tap connected to said first node configured to measure a voltage on said first node and a second voltage tap connected to said second node configured to measure a voltage on said second node.

17. A combined steering wheel heater and hands-on-detector comprising a capacitive occupancy or proximity detector, said capacitive occupancy or proximity detector, comprising
- a heating circuit, including a heating element connected between a first and a second node, said first and second nodes configured to connect said heating circuit to a heating current source;
- an impedance measurement circuit connected to said heating element configured to measure impedance between said heating element and a node at ground potential; and
- a diagnostic circuit configured to measure electrical resistance across said heating circuit between said first and second nodes, said diagnostic circuit including
  - a heating current sensor arranged in said heating circuit, configured to sense a heating current across said heating circuit;
  - a current supply device connected to one of said first and second nodes configured to drive a diagnostic current across said heating circuit; and
  - a current limiting ground path connected to the other of said first and second nodes, configured to drain said diagnostic current and to block said heating current.

18. The combined steering wheel heater and hands-on-detector as claimed in claim 17, wherein said current supply device comprises a voltage source and wherein at least one of said current supply device and said current limiting ground path comprises a diagnostic current sensor configured to sense said diagnostic current.

19. The combined steering wheel heater and hands-on-detector as claimed in claim 17, wherein said current limiting ground path comprises a saturating current sink.

20. The combined steering wheel heater and hands-on-detector as claimed in claim 17, wherein said heating circuit comprises a common mode choke with a first and a second winding, said first winding being connected between said first node and said heating element and said second winding being connected between said heating element and said second node.

21. The combined steering wheel heater and hands-on-detector as claimed in claim 20, wherein said heating current sensor is configured to measure a voltage drop across at least one of said first and second windings.

22. The combined steering wheel heater and hands-on-detector as claimed in claim 17, wherein said current supply device comprises a current source.

23. The combined steering wheel heater and hands-on-detector as claimed in claim 17, wherein said diagnostic circuit is configured to measure a voltage drop between said first and second nodes.

24. The combined steering wheel heater and hands-on-detector as claimed in claim 17, wherein said diagnostic circuit comprises a first voltage tap connected to said first node configured to measure a voltage on said first node and a second voltage tap connected to said second node configured to measure a voltage on said second node.

* * * * *